United States Patent
Carginini et al.

(10) Patent No.: US 8,631,307 B2
(45) Date of Patent: Jan. 14, 2014

(54) METHOD FOR ENCODING AND/OR DECODING MULTIMENSIONAL AND A SYSTEM COMPRISING SUCH METHOD

(75) Inventors: Luis Vitorio Carginini, Montreal (CA); Rubem Dutra Ribeiro Fagundes, Porto Alegre (BR)

(73) Assignee: Uniao Brasileira de Educacao e Assistencia—Mantenedora da PUCRS, Porto Alegre (BR)

( * ) Notice: Subject to any disclaimer, the term of this patent is extended or adjusted under 35 U.S.C. 154(b) by 324 days.

(21) Appl. No.: 12/995,833

(22) PCT Filed: Jun. 2, 2009

(86) PCT No.: PCT/BR2009/000148
§ 371 (c)(1),
(2), (4) Date: Dec. 2, 2010

(87) PCT Pub. No.: WO2009/146517
PCT Pub. Date: Dec. 10, 2009

(65) Prior Publication Data
US 2011/0083062 A1    Apr. 7, 2011

(30) Foreign Application Priority Data
Jun. 2, 2008  (BR) ...................................... 0801767

(51) Int. Cl.
*H03M 13/00*   (2006.01)

(52) U.S. Cl.
USPC ............................ 714/781; 714/752; 714/784

(58) Field of Classification Search
USPC .......................... 714/781, 752, 784, 755, 785
See application file for complete search history.

(56) References Cited

U.S. PATENT DOCUMENTS

| | | | |
|---|---|---|---|
| 6,738,942 B1 * | 5/2004 | Sridharan et al. | 714/755 |
| 6,810,499 B2 * | 10/2004 | Sridharan et al. | 714/755 |
| 7,146,553 B2 * | 12/2006 | Jarchi et al. | 714/755 |
| 2002/0049947 A1 * | 4/2002 | Sridharan et al. | 714/752 |

* cited by examiner

*Primary Examiner* — Fritz Alphonse
(74) *Attorney, Agent, or Firm* — Laurence P. Colton; Smith Risley Tempel Santos LLC (57) ABSTRACT

A method and a system of multidimensional encoding and/or decoding to be processed by a computer or a digital hardware system. The method utilizes an error correcting code which is chosen from the group comprising RS, BCH, BCH algebraic, RM (Reed-Muller), among others. The method is carried out by the steps of attribution of a dimension for each bit in the symbols set of a message, with symbols with at least two bits, so the error correcting code will be performed over the dimensions and not over the symbols; grouping of the dimensions in the same position of the origin symbols in a new symbol, so the symbols will be treated as symbols in both stages of the code, in that the error correcting code is performed in every dimension; and processing of each dimension in parallel or in an independent manner, using an error correcting code.

19 Claims, 3 Drawing Sheets

|     | $d_0$ | $d_1$ | $d_2$ | $d_3$ | $d_4$ | $d_5$ | $d_6$ | $d_7$ |
|-----|---|---|---|---|---|---|---|---|
| $gf_0$ | 0 | 0 | 0 | 0 | 0 | 0 | 0 | 0 |
| $gf_1$ | 0 | 0 | 1 | 1 | 0 | 0 | 0 | 0 |
| $gf_2$ | 1 | 0 | 0 | 1 | 0 | 0 | 0 | 1 |
|        | 0 | 1 | 0 | 0 | 0 | 1 | 0 | 0 |
|        | 1 | 1 | 0 | 0 | 0 | 0 | 1 | 1 |
|        | 0 | 1 | 0 | 1 | 1 | 0 | 0 | 0 |
| $p_0$  | 1 | 0 | 0 | 0 | 0 | 0 | 1 | 1 |
| $p_1$  | 0 | 1 | 0 | 1 | 0 | 1 | 0 | 0 |
| $p_2$  | 1 | 0 | 0 | 0 | 1 | 0 | 0 | 0 |

METHOD FOR ENCODING AND/OR DECODING MULTIMENSIONAL AND A SYSTEM COMPRISING SUCH METHOD

FIELD OF THE INVENTION

This invention consists in a multidimensional detection and error correcting code, based in the BCH method and, especially in the algebraic BCH. The present invention method consists in a symbol treatment, where formative elements are independently dispersed in m dimensions, where each dimension is manipulated independently, exploring a mathematical property, never explored before, leading to an increase in performance and processing speed, allowing a superior correction capability, using the same configurations as those of a similar ECC.

PRIOR ART

Communication Systems

A communication system connects a data source and a data user through a channel. The data are inserted in the communication system through a data source and are processed by a source encoder, designed to represent the data in a more compact way. The representation of this symbols sequence is called source codeword. Then, the data are processed by a channel encoder which transforms the source codeword symbols sequence in another sequence, called channel codeword.

Figure 1:
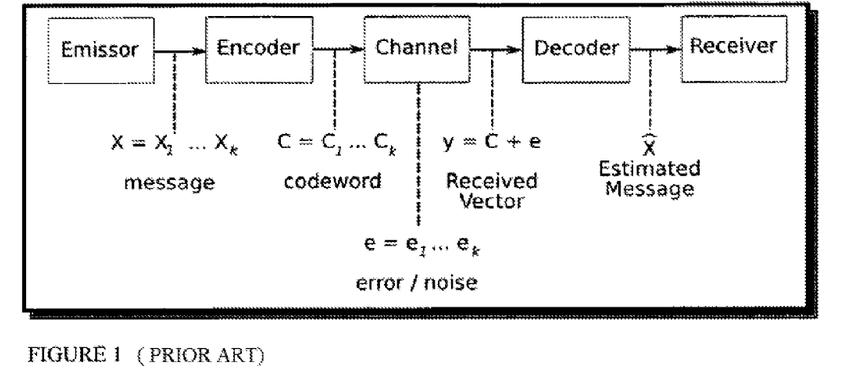
FIG. 1 shows the theoretical/functional model of a communication system, and the insertion point of an error correcting code into the system.
Figure 2:
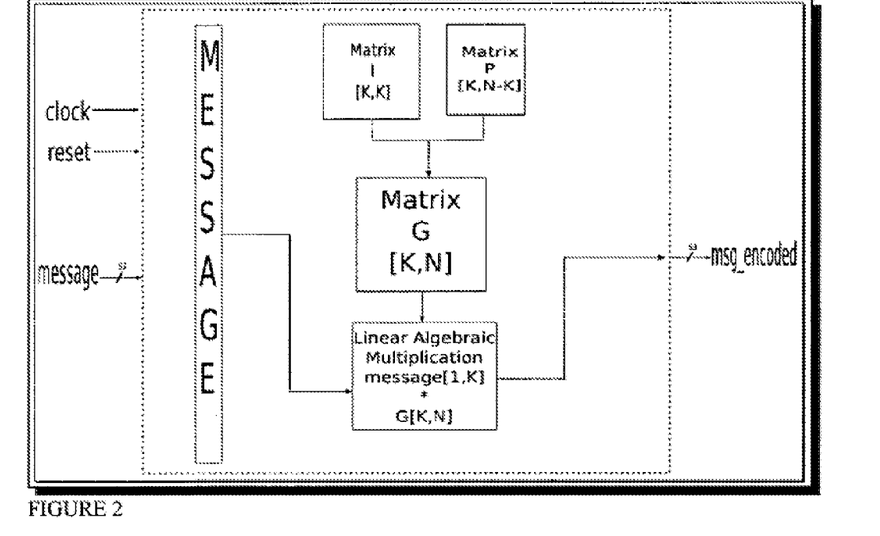
FIG. 2 shows susceptibly the coding method using a BCH Algebraic implementation.
Figure 3:
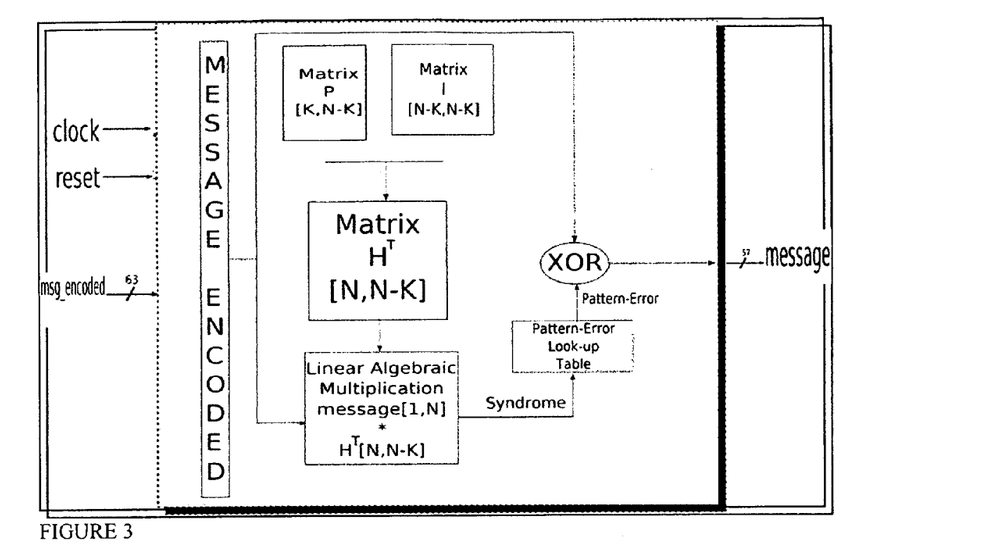
FIG. 3 shows the decoding method using a BCH algebraic, the same as a BCH, but implemented using an algebraic structure instead of a sequential and recursive implementation, that is also viable.
Figure 4:
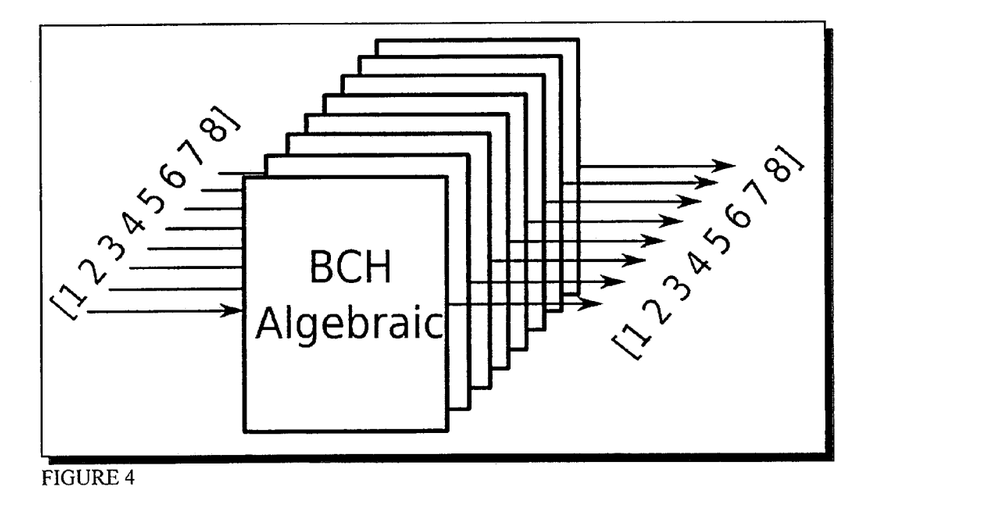
FIG. 4 shows a descriptive flowchart demonstrating the multidimensional error correcting code, the implementation called BCHMD presents a multidimensional error correcting code physical implementation in HDL of the concepts of a multidimensional error correcting code.

The channel codeword is a long new sequence, in which an additional parity information is added to the source codeword. Each channel codeword symbol can be represented by a bit or bit group. The modulator converts each channel codeword symbol in an analogical symbol that corresponds to a finite set of possible analogical symbols. The analogical symbols sequence is transmitted through the channel. Due to errors, the received word symbols are not always equal to the channel codeword symbols. The channel decoder uses the channel codeword parity in order to correct the received word errors and them produces an estimation of the source codeword. If the errors are eliminated, the estimated source codeword is equal to the original source codeword, as shown in FIG. 1

Error Correcting Code—ECC

The Error Correcting Code"—ECC is done through a series of error detection methods applied in the transmitted or stored data and is used to correct them. This can be done in many ways, all of them involving some kind of code. The simplest error detection form is the addition of a parity bit (an extra bit added to the byte or word to reveal errors) in module in base 2 or checking by the CRC.

Data errors in a storage context means any change occurred in the stored value as result of random noise or rupture. In storage system for binary values like 11100100, reminiscent magnetizations states change so much that some 1's become 0's and vice-versa. This may generate an 11000100 sequence, in which the third position value is a random error. A series of errors may transform the sequence to 11111110, in which positions 4, 5 and 7 are mistakes, while position 6 is correct. Most codes will consider position 6 as a mistake of size four, since the first and the last bits (1) determines its size, being it a mistake or not.

Document U.S. Pat. No. 7,127,660 describes an error correcting code, including random errors, using reduced cyclic codes. This method leads a word to a register defined by polynomial with n-k order, where n is the code's size and k the code's number of symbols (information), especially unique random errors, as seen before.

The use of multiple parity symbols may not only detect the occurrence of an error, but also which symbols were inverted and must be reversed in order to restore the original data. The more extra symbols are added, better the chances of detecting and correcting multiple errors.

The importance of error correcting codes can be seen in its practical utilization, such as railroad communication systems, probes, rockets, starships, airplanes, cars, optical and magnetic storage systems, communication systems, mobile communication, digital TV broadcasting and via satellite communications.

A good example of an error correcting code is Reed-Solomon code (RS), which works with polynomial functions built from one data. RS is composed by block codes, where a given block of data input is processed to a related output block of data. Using RS (255,223) case as an example, 223 RS input symbols (represented as residues defined by $GF(2^8)$ ring) are codified in 255 output symbols. The main idea in RS code is that codified data are initially described as a polynomial. The code is based in a linear algebra theorem according to which any given point k determines only one polynomial with order k−1. The polynomial is then generated by a source code multiple point's evaluation and those values are transmitted. During transmission, some of those values may be corrupted. In this sense, more than k symbols may be sent. As those values are correctly received the receptor may deduce which was the original polynomial and decode the original data.

BCH Codes

BCH (Bose-Chaudhuri-Hocquenghem) is an error correcting code based in Multilevel Cyclical Redundancy Code. To Information Theory, BCH code forms an error correcting code class, which has received special attention in the last 50 years. BCH's main advantage is its decoding simplicity. The inventors made use of BCH's matrix algebraic properties, using algebraic methods to encode and to decode.

In BCH codes, initially one should specify the random errors to be corrected and then build the polynomial code generator. They use polynomial theory over Galois Finite Corpus theory, which promotes the reduction of some corpus theory problems in group theory. In order to obtain a finite corpus $GF(q^m)$ code, its elements are represented as polynomials over the $GF(q^m)$ module. Then the polynomial generator $g(x)$ is chosen and the codeword are those multiple polynomial from the generator polynomial.

Document U.S. Pat. No. 6,532,565 describes a memory word detector and correction system generating syndrome vector from a BCH code. In this case, it's a two errors corrector code, proving different values for one and two symbols error sets from the memory detected error set. The combination of BCH two errors correction code adaptation with additional error column detection techniques allows common errors correction and additionally random symbol errors.

Document U.S. Pat. No. 5,721,744 describes a digitally recorded data error correcting system and method, to be used, as an example in magnetic tapes, which involves the choosing of one alternative word with parity correspondent to a parity word from data related to the uncorrected word, recursively between the first and second word, where the second error is detected. This document describes a digital information processing method that includes one or more cyclical words received (n,k), where n is the total words number of symbols and k is the number of symbols in the original message word, there is parity information for each received word, the processing method uses error capture, a generated polynomial and syndromes to find and replace errors in received symbols in order to generate processed symbols, errors of more than $[(n-k)-[\log_2 n]]$ bits positions are corrected.

Document U.S. Pat. No. 5,420,873 describes a decoding system for BCH code to complex random errors correction or burst separately and combine the signal correction with the decoded signal. This system includes a syndrome generator circuit in order to generate two n-bits syndromes corresponding to received signal, one syndrome converter circuit to convert two n-bits syndrome to one 2n-bits syndrome, random error correction circuit, one gust error correction circuit. This system output generates one of the combined signals from combined circuits according to error correction circuit decoding conditions and the result from the comparison between decoded and corrected signals from combined circuits.

Document WO 98/12819 describes a more sophisticated correction system, for multiple errors in burst, frequently used in RS or BCH, detection the amount of errors and the positions of them in a solid burst, using maximum common quotient and not-common factors of errors locations and polynomials errors mapping.

None of those documents presently described here overlap this present invention, because no one has considering a vectorial space dimension that can be used in the BCH coding. The present invention deals with multi-dimensional correction and detection errors method, based on algebraic BCH code. In special, this method here comprehend vectorial spaces with different dimensions, where each symbol dimension is linearly independent from each other and, also, each symbols is linearly independent from each other.

The Algebraic BCH Coding

The BCH coding allows a correction in more than one wrong bit inside of a Word block. The linear algebraic operations performed by BCH are usually executed by computer algorithms like Berlekamp-Massey or Euclidean algorithm. However, a paper from [Cargnini L V, Fagundes R D R, Bezerra E A, Almeida G M, Parallel Algebraic Approach of BCH Coding with VHDL, Computing in the Global Information Technology, March 2007 Page(s): 22-22] [1] (some of them are the authors of this to present invention) has demonstrated that is possible to perform the BCH coding directly from the algebraic approach, and such system was built in a digital hardware device, using HDL (Hardware Description Language) and VHDL (VLSI Hardware Description Language) [2, 3, 4, 5, 6, 7, 8]. This algebraic approach will explore the advantages of a digital hardware realization, like parallel operations and high performance due to specific hardware integration [9, 10, 11, 7, 3, 6, 12, 13, 14, 15, 16, 17]. As consequence, this new approach leads to enhanced speed, hardware area reduction and reduced machine cycles to perform a BCH.

The polynomial generator g(X), $g(x)=x^6+x^5+1$, has a linear algebraic version G expressed by equation I [18, 19]:

$$G_{k,n}=[I_{k,k}|P_{k,n-k}] \quad (I)$$

wherein k are the input symbols, n are the output symbols, the I-matrix is the identity and sub-matrix P is the parity matrix, expressed by equation II:

$$P_{k,n-k} = \sum_{i=n-k+1}^{k+(n-k)} (x^i \bmod g(x)) \bmod 2 \quad (II)$$

and the BCH coding is performed by equation III [18, 19]:

$$\vec{m}=m*G \quad (III)$$

wherein $\vec{m}$ is k bits message vector, m is the n bits codified version and G is the generator matrix $G_{n,k}$ (called coding matrix)

The codification process comprises the following steps:
a) Generation of coding matrix G:
b) Generation of $\vec{m}$ The generation of matrix G will be performed just once, because G will remain as a constant value for a given coding scheme. The generation of vector $\vec{m}$ is the codification process itself, because $\vec{m}$ is coded version of, the m message vector created by BCH for every message vector transmitted trough communication channel.

The FIG. 1 presents the codification method using the algebraic BCH.

The decoding process is denoted by equation (IV) [18, 19, 20]}:

$$\vec{S} = \sum_{i=0}^{n-k} s(i) = \vec{m}*H^T \quad (IV)$$

wherein $\vec{S}$ is usually called syndrome vector $\vec{S}$, and $H^T$ is well known as parity check matrix, expressed by equation (V).

$$H^T = \left[\frac{P_{k,n-k}}{I_{k,k}}\right] \quad (V)$$

From (IV) where P and I are the same sub-matrix used to create G, the syndrome vector $\vec{S}$ play a main rule in the decoding process, because this vector directly identifies any given error occurred in the transmission channel.

When $\vec{S}$ is the zero vector Ø, there is no errors in the transmission process and the message is achieved by removing parity bits from $\vec{m}$.

However, if $\vec{S}$ is not the Ø vector, the $\vec{S}$ vector resulting from (IV) will lead to the pattern-error ê stored in the decoder as a look-up table and this pattern-error will correct the message by:

$$m=\vec{m}+\hat{e} \quad (VI)$$

wherein the sum in (VI) is a XOR logic operation performed bitwise between $\vec{m}$ and ê.

Some specialized reports described the state of the art related with the topic of this invention, and such documents are analyzed below:

Document US 2004/0103362 describes a method and system to code and decode packages of data with a ECC coding, were the errors does not spread to more than a limited amount of bits in the data package. In order to do this, a chain of m-bits will code the method to a communication device, which is involved in a bit chain coding through the chain matrix multiplication, where the more significant bit will be chains and the others will be zero.

The present invention is different from this document, because this invention works with the data dimensions, given one dimension for each bit-element from the message symbols. Document U.S. Pat. No. 7,134,067 describes a system and method to allow a direct decoding of 'FIRE' coding and other similar coding system. This kind of coding system, like the FIRE, will perform an error pattern identification, as main information for processing and correct the message. In this present invention, the method can run at high speeds, such as Tera-BYTES/second and does not require any kind of error pattern to be identified in the process.

The document U.S. Pat. No. 5,420,873 describes a system for BCH decoding and correction of random complex errors and burst errors, separately, combining the signal correction with the signal decoding. This system includes a syndrome generator circuit, to generate two n-bits syndromes (corresponding of the received signal) a syndrome converting circuit, in order to convert two n-bit syndromes into a 2n-bit syndrome, a random errors correcting circuit and a burst error correcting circuit. The system output selectively generate one of the combined signals from the circuits, following the decoding conditions observed by the correction errors circuits and the results from comparison between decoded signals and corrected signals.

This present invention is different from the document U.S. Pat No. 5,420,873, because deals with coding and decoding system, not only decoding technique, and because this present invention associate a vectorial dimension for each symbol.

The document U.S. Pat No. 7,281,660 describes a method to code bi-dimensional images, using one or more ECC, generating a fixed amount of words and a comparative method with three kinds of areas in the image: a standard area, an adjusting area and data area.

This present invention is different because deals with a multi-dimensional technique, with no necessary relations about the nature of the original message to be codified (no matter is image, sound, speech, bio-signals and so on).

SUMMARY OF THE INVENTION

It is an object of present invention a coding and decoding method comprising the following steps:
(A) attribution of one dimension for each bit of a message related to symbols, symbols that are composed for at least 2 (two) bits;
(B) grouping of the dimensions in same position of the symbols of departure in a new symbol;
(C) parallel processing of each dimension, using error correcting codes;

A preferred error correcting code is the BCH or BCH algebraic.

It is an additional object of the current invention a method and a system for coding and/or decoding comprising the following steps:
(A) attribution of one dimension for each bit of the symbols of a message, where this symbols are composed at least by bits, that is m≥2;
(B) grouping of the dimensions in same position of the symbols of departure in a new symbol;
(C) parallel processing of each dimension, using error correcting codes;

In a preferred embodiment, the system is a hardware (IP-Core) or a software, any language for software development like C/C++ or Java can be employed also the hardware is implemented using a HDL (Hardware Description Language), for the particular case of the experiments to demonstrate the viability of the theory was used VHDL (VLSI Hardware Description Language).

DETAILED DESCRIPTION OF THE INVENTION

The contained examples has the single purpose of demonstrate and exemplify one of many possible implementations of the proposed multidimensional error correcting code, without limitations, since that any other similar implementations is inside of the scope of the present invention, methodology and process Method of Encoding and/or Decoding The coding or decoding method of present invention comprises the following steps:
(A) attribution of a dimension for each element that compose a symbol, of a message, message composed by symbols, which symbols are composed at least 2 bits, so if a message is composed by 234 symbols, n will be 234, this 180 are k, so 180 symbols compose the message codified by the system, so we obtain 2t=54 symbols, where each symbol is composed by at least one bit (in the case of a single bit composes my symbol, the known BCH can be employed or the BCH algebraic, despite for symbols of m≥2, where m is the number of bits that compose each symbol or the dimension of the Galois field defined by the formulation GF($2^m$), that define the ring composed by symbols of m bits, without limit of maximum size to be used in the symbol representation;
(B) grouping of dimensions in same position of symbols in a new (depart) symbol;
(C) parallel processing of each dimension using a error correcting code;

Specifically the content of the message is binary information, composed by a set of symbols of pre-defined sizes and each symbol aggregates a set of elements. The elements of a binary message are its bits and each symbol must contain at least two bits to a multidimensional error correcting code being applied.

System for Encoding and/or Decoding

The current invention also contemplates a system for coding and decoding employing the multidimensional error correcting code, described in this document. Such system can be employed in transmission and reception of data by, for example, optic fiber, wireless networks such as 3G, WiMax, WiFi, satellite communication also in computer networks, also in applications as broadcasting of digital radio and digital television.

Linear Code

In mathematics, in abstract algebra and information theory, a linear code is an important type of block code used in error correction codes and schemes. Linear codes allow for more efficient encoding and decoding algorithms than other codes (cf. syndrome decoding) [18, 19, 20].

Linear codes are applied in methods of transmitting symbols (e.g., bits) on a communications channel [21, 18, 19, 22] so that, if errors occur in the communication, some errors can be detected by the recipient of a message block. The "codes" in the linear code are blocks of symbols which are encoded using more symbols than the original value to be sent. A linear code of length n transmits blocks containing n symbols. For example, the "(7,4)" Hamming code is a binary linear code which represents 4-bit values each using 7-bit values. In this way, the recipient can detect errors as severe as 2 bits per block. As there are 16 distinct 4-bit values expressed in binary, the size of the (7,4) Hamming code is sixteen.

A linear code of length n and rank k is a linear subspace C with dimension k of the vector space $\mathbb{F}_q^n$ where $\mathbb{F}_q^n$ is the finite field with q elements [23, 24, 25, 26, 27, 28, 29, 30, 31, 32]. Such a code with parameter q is called a q-ary code (e.g., when q=5, the code is a 5-ary code). If q=2 or q=3, the code is described as a binary code, or a ternary code respectively.

Remark: We want to give $\mathbb{F}_q^n$ the usual standard basis because each coordinate represents a "bit" which is transmitted across a "noisy channel" with some small probability of transmission error (a binary symmetric channel). If some other basis is used then this model cannot be used and the Hamming metric (defined next) does not measure the number of errors in transmission, as we want it to.

Convolutional Code

In telecommunication a convolutional [18, 19, 33, 34, 35, 36] code is a type of error correcting code in which (a) each information symbol of m-bit length to be encoded is transformed into an n-bit symbol, where m/n is the code rate (n≥m) and (b) the transformation is a function of the last k information symbols, where k is the constraint length of the code.

Simple convolutional codes are now giving way to turbo codes (a class of high-performance), a new class of iterated short convolutional codes that closely approach the theoretical limits imposed by Shannon's [21] theorem with much less decoding complexity than the Viterbi algorithm on the long convolutional codes that would be required for the same performance.

Based on this code RS, RM and BCH are considered linear block codes, in the specific case of RS it is classified as a convolutional code [37, 38, 32].

EXAMPLE 1

BCHMD Code

The multidimensional error correcting code named BCHMD, has the purpose of codifying symbols, symbols that are Galois Fields—$GF(2^m)$—for m≥2. The BCHMD code considers that an Error Correcting Code (ECC) works because of vectorial spaces condition, which ECC are based.

That is, a encoder like BCH or RS only works because they represents a vectorial space of n-tuples, in which each tuple is linearly independent from each other. Extending this idea, the BCHMD was constructed (the prototype) based on the algebraic BCH, for coding and decoding using a algebraic BCH in each dimension of the Galois fields independently, each bit of the Galois field is considered in a different dimension, and each dimension of the Galois field will be considered as a dimension of the vectorial space of the symbols to be encoded.

In other words, when encoding a set of symbols with RS, these symbols are tuples of bits. Each symbol is composed generally by 8 bits. Therefore, when RS encode, let's assume as configuration n=63, k=57, this means that the RS code encode 57 symbols of input, generating an output of 63 symbols, being 6 symbols of parity, joined with the k symbols of data. Therefore each symbol in true is a tuple of bits and the message is a tuple of symbols.

So each symbol can be seen as a vectorial space of dimension m, since each symbol is a Galois field of space $GF(2^m)$, generally also in our example, adopt m=8.

Based on publications that discuss the subject of linear systems and linear and abstract Algebra, each symbol dimension is linearly independent as each symbol is linearly independent of each one. In this sense the encoding process is performed for each dimension of the symbols and each dimension is considered linearly independently. The BCHMD example is applied to symbols of more than one bit to demonstrate the pertinence and viability of the multidimensional error correcting code.

Take as example the ring $GF(2^8)$, which means 256 quadratic residues or residual fields, also Galois fields where each fields is linearly independent of others. It is desired to construct a code, multidimensional ECC (MECC) example of implementation BCHMD, align in parallel m codes of BCH algebraic for example, to encode or even to decode the bit stream of each dimension in the vectorial space.

We can exemplify the following set of symbols input of the BCHMD, that are residues of the ring $GF(2^8)$ as:

$\alpha_1$=00000000;
$\alpha_2$=00000010;
$\alpha_3$=00000100;
$\alpha_4$=00001000;
$\alpha_5$=00010000;
$\alpha_6$=00100000;
$\alpha_7$=01000000;
$\alpha_8$=10000000.

The mapping of the symbols dimensions for each algebraic BCH is denoted in this manner for the symbols $\alpha_1$, $\alpha_4$ and $\alpha_8$:

$$BCH0 = \alpha1(0), \alpha2(0), \alpha3(0), \alpha4(0), \alpha5(0), \alpha6(0), \alpha7(0), \alpha8(0)$$

...

$$BCH4 = \alpha1(0), \alpha2(0), \alpha3(0), \alpha4(0), \alpha5(1), \alpha6(0), \alpha7(0), \alpha8(0)$$

...

$$BCH8 = \alpha1(1), \alpha2(0), \alpha3(0), \alpha4(0), \alpha5(0), \alpha6(0), \alpha7(0), \alpha8(0)$$

In this manner, the MECC-BCHMD is capable to obtain performance superior to the similar RS code using the same configuration of the RS. The BCHMD for instance in its worst case achieve the same performance as the similar RS in its best case. This performance improvement related to the RS is only possible due to the fact that the BCHMD is working over the dimensions of the fields in an independent manner.

From the perspective of an hardware implementation the BCHMD is achieving better performances because of the algebraic implementation of its code, not employing sequential or iterative algorithms or even worse a sequence of iterative algorithms like the case of RS implementing the Berlekamp-Massey or Euclidean approaches.

Another important factor is implementing the MECC-BCHMD in hardware or in software the performance of the code is always superior to a RS implementation.

For example, to implement RS(Berlekamp-Massey), it will be necessary 57 clock cycles to generate the parity symbols, using symbols of 8 bits each. For the BCHMD example no matter the size of the field the number of clock cycles will be always the same because each dimension is processed independently, and in parallel in a hardware implementation, and the time is fixed for each dimension. This means that is possible to use higher symbols GF($2^m$), through m with values higher than 8.

If needed a code with n,k with higher values, this won't be a problem, because in hardware implementation or even in a software implementation the BCH or algebraic BCH can operate in parallel in each dimension. The increase in the symbol size or in the number of symbols, increase only in area or code increasing. Not affecting necessarily the performance of the system. In a hardware implementation the encoding time never increased above 0.5 (half) clock cycle, the frequency being not the measurement unit, but the machine clock cycles. This is possible because of the matrix implementation of the BCH algebraic in the hardware prototype using HDL.

So the approach for implementing the MECC-BCHMD is to explore all possible parallelism exploring the linear independence of the fields. In this manner the processing time is deterministic, also using the algebraic approach. Besides, the MECC-BCHMD is not limited as the RS into the t and 2t, parameters of correction capacity and detection of errors, despite the vectorial space dimensional size it will determine the linear combination of maximum capacity of detection and correction of errors, also it is possible to denote that, as mentioned before, this linear independence of the fields that give us the ability to achieve as the worst case scenario for the MECC-BCHMD as the maximum capacity of a similar RS code.

Explaining in a RS (63,57):
the detection capacity 2t=63−57=6,
the correction capacity t=2t/2=3,
Since the MECC-BCHMD explore this dimensionally using a BCH algebraic the minimal difference is for the BCHMD (63,57):
the detection capacity 2t=63−57=6,
the correction capacity t=2t/2−1=2,
So dimensionally I can correct up to 2 errors at same time, since my symbol has 8 bits for example this means 8 times 2, that is 16 the maximum capacity of my multidimensional error correcting code compared with the similar RS. The MECC-BCHMD has as capacity t*m, the combination of the linear spaces of the code. this configurations t and 2t are applied not for the code, but for vectorial dimensions and not to the symbols or the set of symbols, this configuration affects only the dimensional capacity of MECC-BCHMD because it is based on algebraic BCH, any other multidimensional error correcting code (MECC) will be affect in different manners, regarding values of dimensional capacity, but the resulting behavior will be same for all MECC.

EXAMPLE 2

Comparing the Codes RS and the MECC Implementation BCHMD

The comparison between MECC-BCHMD and RS for the same configuration (63,57) and the possible error patterns that each code can detect and correct are demonstrate as follow:

$$C\binom{63}{3} = \frac{63!}{3!(63-3)!} = \frac{63 \times 62 \times 61}{6} = 39.711$$

$$m \times C\binom{63}{3} = m \times \frac{63!}{3!(63-3)!}$$
$$= m \times \frac{63 \times 62 \times 61}{6}$$
$$= (m = 8) \times 39.711$$
$$= 317.688$$

In the equations of combinations, all the possible linear combinations of error patterns that the specific configurations is capable to identify and correct for each error correcting code comparing the capacities of RS and BCHMD are presented. The BCHMD capacity is the linear combination of all vectorial dimensions to define all the possible pattern errors of each. One positive factor about this implementation of multidimensional error correcting code is the fact that the bigger the Galois field GF($2^m$) the value of m, the higher the capacity of detection and correction of this code.

Figure 5:
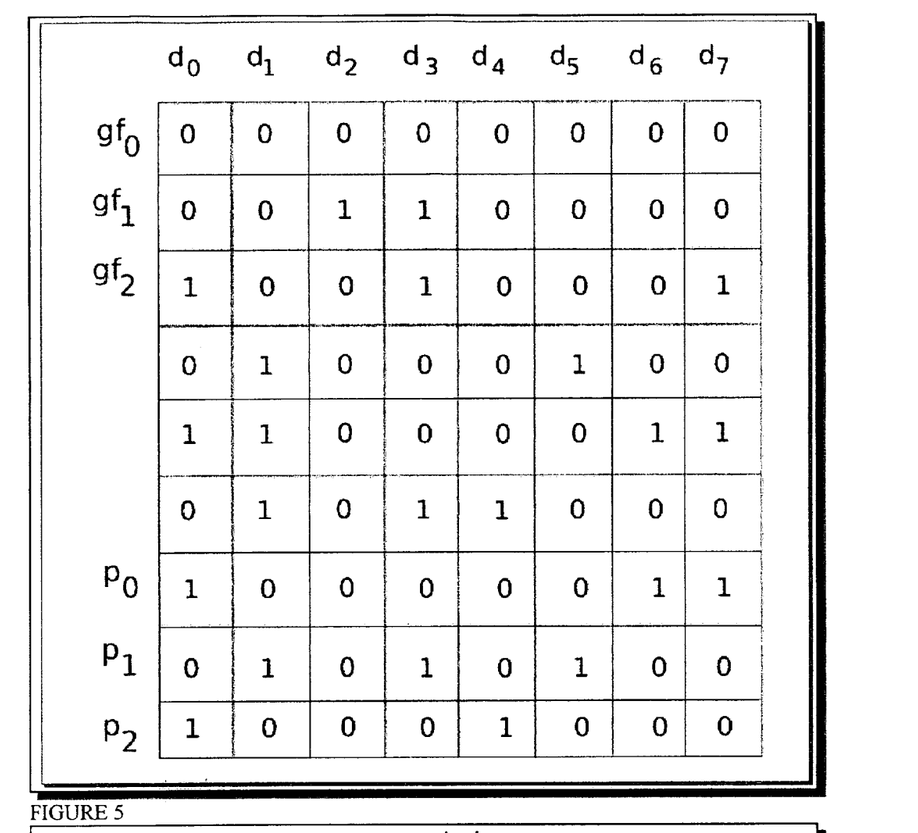
FIG. 5 is an example of symbols of a message ($gf_k$) in a sequence, size k of message could be any, in the end of the message are the parity symbols $p(p_{n-k})$, that number of parity symbols more number of message symbols is equal to n. The figure also denotes the representation of each symbol multi-dimensionally ($d_b$), each column represents each one of the dimensions of the symbol, so that the figure depict the organization of the data for input and output of the coding and decoding process and how the multidimensionality works.
Figure 6:
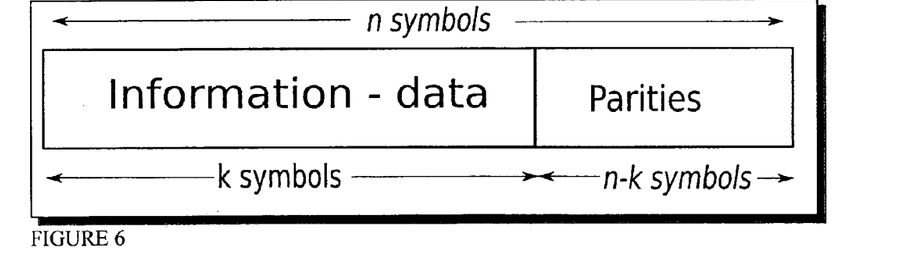
FIG. 6 depicts the message composed by the parity in the fashion to be transmitted by the communication system data+parity (parity in the end or beginning of the message is implementation dependent, for the purposes of this text we are assuming the insertion of the parities in the end).

In FIG. 5, the columns represents the vectorial dimensions ($d_0, \ldots, d_m$), in the positions that appear filled with 'X', they represents the presence of introduced errors in the encoded message, for demonstration we are adopting a code (63,57), whose RS code is capable of correct only 3 symbols, with erroneously bit in the symbol, while the MECC-BCHMD is capable of detect and correct all the errors inserted in the m dimensions of the symbols, gf means the Galois Fields that compose the message and the elements p represents the parity symbols of the message.

The MECC-BCHMD and RS codes were implemented for comparison using the configuration (63,57). Below is Table 1, demonstrating the results of the synthesis in hardware of both codes, implemented using a VHDL description:

TABLE 1

| | BCHMD | RS |
|---|---|---|
| Encoder | 579/15360 (3%) | 5233/15360 (34%) |
| | 778.452 Mhz | 63.235 Mhz |
| Decoder | 654/15360 (4%) | 3202/15360 (20%) |
| | 778.452 Mhz | 152.497 Mhz |

For testing purposes of the capacity between the codes, was used the following set of errors introduced in a message, gradually, which means: first test introduce the error in the symbol 50, second in the symbols 50 and 49 and so on, plus of course the twelve errors independently :

(reg_msg_err(50)<="00000001";
reg_msg_err(49)<="00000010";
reg_msg_err(48)<="00000100";
reg_msg_err(47)<="00001000";
reg_msg_err(46)<="00010000";
reg_msg_err(45)<="00100000";
reg_msg_err(44)<="01000000";
reg_msg_err(43)<="10000000";
reg_msg_err(42)<="00000011";
reg_msg_err(41)<="00001100";
reg_msg_err(40)<="00110000";
reg_msg_err(39)<="11000000";
reg_msg_err(38)<="11111111";).

In the end a set of at least 144 tests were performed sequentially and gradually to measure the ECCs capacity and differences. The first test was to insert an error in the less significative bit of symbol 50, until we insert all the errors in the message and test a message with the maximum possible number of errors in all dimensions and test the capacity of both codes in same conditions.

After perform the tests in the hardware implementation, the results are complied in Table 2.

TABLE 2

|  | No. bits | 1 symbol | 2 symbols | 3 symbols | 4 symbols | 5 symbols | 6 symbols |
|---|---|---|---|---|---|---|---|
| RS | 1 | PASSED | PASSED | PASSED | FAILED | FAILED | FAILED |
| BCHMD |  | PASSED | PASSED | PASSED | PASSED | PASSED | PASSED |
| RS | 2 | PASSED | PASSED | PASSED | FAILED | FAILED | FAILED |
| BCHMD |  | PASSED | PASSED | PASSED | PASSED | PASSED | PASSED |
| RS | 3 | PASSED | PASSED | PASSED | FAILED | FAILED | FAILED |
| BCHMD |  | PASSED | PASSED | PASSED | PASSED | PASSED | PASSED |
| RS | 4 | PASSED | PASSED | PASSED | FAILED | FAILED | FAILED |
| BCHMD |  | PASSED | PASSED | PASSED | PASSED | PASSED | PASSED |
| RS | 5 | PASSED | PASSED | PASSED | FAILED | FAILED | FAILED |
| BCHMD |  | PASSED | PASSED | PASSED | PASSED | PASSED | PASSED |
| RS | 6 | PASSED | PASSED | PASSED | FAILED | FAILED | FAILED |
| BCHMD |  | PASSED | PASSED | PASSED | PASSED | PASSED | PASSED |

In this table the relations between the codes were presented, depicting the capacity of correction of each code for the same configuration, one following the traditional approach the RS and the other the BCHMD a implementation of MECC approach. Each column represents the number of symbols with m bits, containing errors in the message, each line represents the code for each specific number of erroneously bits by number of symbols for example line of 3 bits in column of 4 symbols means 4 symbols containing 3 erroneously bits in the message symbol.

The presented data denote the obtained results of the implementations of both codes in hardware implementation. This data do not represent the limits of this process of technique of MECC, but they represent one example of possible implementation developed to demonstrate the potential of the MECC. The process can be applied for any known model of ECC. The MECC-BCHMD gives the ability of new configurations of n and k, generating even larger possibilities of ECC, also still possible the inclusion of other techniques to improve the performance of the multidimensional error correcting code. It gives yet the possibility of implementing impossible ECC schemes adopting RS as base.

REFERENCES

[1] L. V. Cargnini, R. D. R. Fagundes, E. A. Bezerra, and G. M. Almeida, "Parallel algebraic approach of bch coding in vhdl," in Computing in the Global Information Technology, 2007. ICCGI 2007. International Multi-Conference on, March 2007, pp. 22-22.
[2] P. J. Ashenden, The VHDL Cookbook, 1st ed. Dept. Computer Science, University of Adelaide, South Australia: University of Adelaide, 1990.
[3] P. Banerjee, Paral lel algorithms for VLSI computer-aided design, N. Englewood Cli☐s, Ed. Prentice-Hall, 1994.
[4] N. H. E. W. . K. Eshraghian, Principles of CMOS VLSI design: a systems perspective. Addison-Wesley, 1994.
[5] A. Kunzmann, Reuse techniques for VLSI design, R. Seepold, Ed. Kluwer Academic, 1999.
[6] V. K. Madisetti, VLSI digital signal processors: an introduction to rapid prototyping and design synthesis. Butterworth-Heinemann, 1995.
[7] N. Sherwani, Algorithms for VLSI physical design automation. Kluwer Academic, 1999.
[8] Y. Taur and T. H. Ning, Fundamentals of modern VLSI devices, C. U. Press, Ed. Cambridge University Press, 1998.
[9] X. Zhang and K. Parhi, "High-speed architectures for parallel long bch encoders," Very Large Scale Integration (VLSI) Systems, IEEE Transactions on, vol. 13, no. 7, pp. 872-877, July 2005.
[10] Y. Chen and K. Parhi, "Small area parallel chien search architectures for long bch codes," Very Large Scale Integration (VLSI) Systems, IEEE Transactions on, vol. 12, no. 5, pp. 545-549, May 2004.
[11] —, "Small area parallel chien search architectures for long bch codes," Very Large Scale Integration (VLSI) Systems, IEEE Transactions on, vol. 12, no. 5, pp. 545-549, May 2004.
[12] H. Lee, "An area-e☐cient euclidean algorithm block for reed-solomon decoder," in VLSI, 2003. Proceedings. IEEE Computer Society Annual Symposium on, 20-21 Feb. 2003, pp. 209-210.
[13] Z. Chi and K. Parhi, "High speed algorithm and vlsi architecture design for decoding bch product codes," in Acoustics, Speech, and Signal Processing, 2002. Proceedings. (ICASSP '02). IEEE International Conference on, vol. 3, 13-17 May 2002, pp. III-3089-III-3092 vol. 3.
[14] Z. Jun, W. Zhi-Gong, H. Qing-Sheng, and X. Jie, "Optimized design for high-speed parallel bch encoder," in VLSI Design and Video Technology, 2005. Proceedings of 2005 IEEE International Workshop on, 28-30 May 2005, pp. 97-100.
[15] Z. Chi and K. Parhi, "High speed algorithm and vlsi architecture design for decoding bch product codes," in Acoustics, Speech, and Signal Processing, 2002. Proceedings. (ICASSP '02). IEEE International Conference on, vol. 3, 13-17 May 2002, pp. III-3089-III-3092 vol.3.
[16] C. Schuler, "Code generation tools for hardware implementation of fec circuits," in Electronics, Circuits and Systems, 1999. Proceedings of ICECS '99. The 6th IEEE International Conference on, vol. 1, 5-8 Sept. 1999, pp. 221-224 vol. 1.
[17] A. Ahmed, R. Koetter, and N. Shanbhag, "Vlsi architectures for soft-decision decoding of reed-solomon codes," in Communications, 2004 IEEE International Conference on, vol. 5, 20-24 Jun. 2004, pp. 2584-2590 Vol. 5.
[18] B. Sklar, Digital Communications: Fundamentals and Applications, 2nd ed., ser. Prentice Hall Communications Engineering and Emerging Technologies Series., P. H. PTR, Ed. Bernard Goodwin, January 2001, day 11. [Online]. Available: http://books.google.com/books?id=7nMRAAAACAAJ&dq=Digital+Communications: +Fundamentals+and+Applications&hl=fr
[19] R. B. Wells, Applied Coding and Information Theory for Engineers, M. Horton, Ed. Upper Saddle River, N.J., USA: Prentice-Hall, Inc.—Tom Robbins, 1999. [Online]. Available: http://books.google.com/ books?id=yN4AAAAACAAJ&dq=Applied+Coding+ and+Information+Theory+for+Engineers&hl=fr
[20] R. H. Morelos-Zaragoza, The Art of Error Correcting Coding, 1st ed. John Wiley & Sons, 2002. [Online]. Available: http://the-art-of-ecc.com
[21] C. E. Shannon, "A mathematical theory of communication," Bel 1 systems Technical Journal, vol. 27, pp. 379-423, 623-656, 1948.
[22] P. Chen, "Multisequence linear shift register synthesis and its application to bch decoding," Communications, IEEE Transactions on [legacy, pre-1988], vol. 24, no. 4, pp. 438-440, April 1976.
[23] K. Levitt and J. Wolf, "A class of nonlinear error correcting codes based upon interleaved two-level sequences (corresp.)," Information Theory, IEEE Transactions on, vol. 13, no. 2, pp. 335-336, April 1967.
[24] K. H. . R. Kunze, Linear algebra, 2nd ed. Prentice-Hall Inc, 1971.
[25] K. R. Matthews, Elementary Linear Algebra. University of Queensland—Department of Mathematics, 1991.
[26] E. H. Connell, Elements of Abstract and Linear Algebra. E. H. Connell Department of Mathematics University of Miami P.O. Box 249085 Coral Gables, Fla. 33124 USA ec@math.miami.edu: Department of Mathematics University of Miami, March 2004. [Online]. Available: http://www.math. miami.edu/☐ec/book/
[27] A. S. e Paulo Winterle, Introducão á Algebra Linear. Makron Books, 1990.
[28] K. Ho☐man and R. Kunze, Linear Algebra. Prentice Hall International, INC., 1971.
[29] C. -T. Chen, Linear system theory and design, 3rd ed., ser. The Oxford Series in Electrical and Computer Engineering. New York, N.Y., USA: Oxford University Press, Inc., 1999.
[30] T. Kaufman and S. Litsyn, "Almost orthogonal linear codes are locally testable," in Foundations of Computer Science, 2005. FOCS 2005. 46th Annual IEEE Symposium on, 23-25 Oct. 2005, pp. 317-326.
[31] N. Benvenuto, P. Bisaglia, and A. Jones, "Turbo detection and variable rate coding in systems using linear block codes and block interleavers," in Vehicular Technology Conference, 1999. VTC 1999- Fal 1. IEEE VTS 50th, vol. 3, 19-22 Sep. 1999, pp. 1555-1559 vol. 3.
[32] M. Alekhnovich, "Linear diophantine equations over polynomials and soft decoding of reed-solomon codes," in Foundations of Computer Science, 2002. Proceedings. The 43rd Annual IEEE Symposium on, 16-19 Nov. 2002, pp. 439-448.
[33] J. Rosenthal and F. York, "Bch convolutional codes," Information Theory, IEEE Transactions on, vol. 45, no. 6, pp. 1833-1844, September 1999.
[34] C. H. Lai and S. Kallel, "An e☐cient convolutional coding/decoding strategy for channels with memory," Communications, IEEE Transactions on, vol. 43, no. 11, pp. 2678-2686, November 1995.
[35] H. Owens, M. Georgiopoulos, and M. Belkerdid, "Performance of bch and convolutional codes in direct sequence spread spectrum packet radio networks," in Military Communications Conference, 1989. MILCOM '89. Conference Record. 'Bridging the Gap. Interoperability, Survivability, Security'., 1989 IEEE, 15-18 Oct. 1989, pp. 184-188 vol. 1.
[36] B. Smith, M. Georgiopoulos, and M. Belkerdid, "Comparison of bch and convolutional codes in a direct sequence spread spectrum multiple access packet radio network," in Military Communications Conference, 1991. MILCOM '91, Conference Record, 'Military Communications in a Changing World'., IEEE, 4-7 Nov. 1991, pp. 1028-1032 vol. 3.
[37] I. S. Reed and G. Solomon, "Polynomial codes over certain finite fields," J. SIAM, vol. 8, no. 2, pp. 300-304, June 1960.
[38] E. R. Berlekamp, Algebraic Coding Theory, Revised Edition (M-6) (Paperback). Aegean Park Press; Revised edition, June 1984.

The invention claimed is:

1. A method of multidimensional encoding and/or decoding, the method being executed by a computer or a digital hardware system, comprising the steps of:
   a) attribution of a dimension for each bit in a symbols set of a message, with symbols with at least two bits, so an error correcting code is performed over the dimensions and not over the symbols;
   b) grouping of the dimensions in the same position of origin symbols in a new symbol, so the symbols will be treated as symbols in both stages of the code, in that the error correcting code is performed in every dimension; and
   c) processing of each of the dimensions in parallel or in an independent manner, using the error correcting code.

2. The method according to claim 1, wherein the error correcting code is the same for each of the dimensions.

3. The method according to claim 1, wherein the error correcting code is different for each of the dimensions.

4. The method according to claim 1, wherein the origin symbols comprise any configuration, value for m, for $m \geq 2$ bits.

5. The method according to claim 1, wherein the error correcting code is selected from the group consisting of RS, BCH, BCH algebraic, RM (Reed-Müller), binary, linear, linear block, convolutional, turbo code, and quantical ECC.

6. A system for encoding and/or decoding, the system comprising a computer or a digital hardware system, the system further comprising a method executed by the computer or the digital hardware system, the method comprising the steps of:
   a) attribution of a dimension for each bit of a message, with symbols of the message having at least two bits;
   b) grouping of the dimensions in same position of origin symbols in a new symbol; and
   c) processing of each of the dimensions in parallel or in an independent manner, using an error correcting code for each of the dimensions.

7. The system according to claim 6, wherein the error correcting code is the same for each of the dimensions.

8. The system according to claim 6, wherein the error correcting code is different for each of the dimensions.

9. The system according to claim 6, wherein the origin symbols possess any configuration of m, for $m \geq 2$ bits.

10. The system according to claim 6, wherein the error correcting code is selected from the group consisting of RS, BCH, BCH algebraic, RM (Reed-Müller), binary, linear, linear blocking, convolutional, turbo code, and quantical ECC.

11. The system according to claim 6, used in information transmission and information reception, where the information is data processed by the error correcting code.

12. The system according to claim 11, wherein the error correcting code is employed in a means selected from the group consisting of optic fibers, wireless systems, radio systems, television broadcasting, telemetry and data transmission systems, breaking systems for cars, trains, and airplanes, communications systems for satellites, rockets, memory access, missiles, and spaceships.

13. A system for encoding and/or decoding, the system comprising a computer or a digital hardware system, the system further comprising a method executed by the computer or the digital hardware system, the method comprising the steps of:

a) attribution of a dimension for each bit in a symbols set of a message, with symbols with at least two bits, so an error correcting code is performed over the dimensions and not over the symbols;
  b) grouping of the dimensions in the same position of origin symbols in a new symbol, so the symbols will be treated as symbols in both stages of the code, in that the error correcting code is performed in every dimension; and
  c) processing of each of the dimensions in parallel or in an independent manner, using the error correcting code.

14. The system according to claim 13, wherein the error correcting code is the same for each of the dimensions.

15. The system according to claim 13, wherein the error correcting code is different for each of the dimensions.

16. The system according to claim 13, wherein the origin symbols possess any configuration of m, for m≥2 bits.

17. The system according to claim 13, wherein the error correcting code is selected from the group consisting of RS, BCH, BCH algebraic, RM (Reed-Müller), binary, linear, linear blocking, convolutional, turbo code, and quantical ECC.

18. The system according to claim 13, used in information transmission and information reception, where the information is data processed by the error correcting code.

19. The system according to claim 18, wherein the error correcting code is employed in a means selected from the group consisting of optic fibers, wireless systems, radio systems, television broadcasting, telemetry and data transmission systems, breaking systems for cars, trains, and airplanes, communications systems for satellites, rockets, memory access, missiles, and spaceships.

* * * * *

UNITED STATES PATENT AND TRADEMARK OFFICE
CERTIFICATE OF CORRECTION

PATENT NO. : 8,631,307 B2
APPLICATION NO. : 12/995833
DATED : January 14, 2014
INVENTOR(S) : Luis Vitorio Carginini and Rubem Dutra Ribeiro Fagundes It is certified that error appears in the above-identified patent and that said Letters Patent is hereby corrected as shown below:

On the Title Page, Item (54) and in the Specification, in Column 1, lines 1-3, in the Title, replace the misspelled word "multimensional" with --multidimensional-- as follows:

--METHOD FOR ENCODING AND/OR DECODING MULTIDIMENSIONAL AND A SYSTEM COMPRISING SUCH METHOD--

Signed and Sealed this
Sixth Day of May, 2014

Michelle K. Lee
*Deputy Director of the United States Patent and Trademark Office*